INVENTORS
JAMES H. BUTLER
DUDLEY A. CHANCE
SAMUEL S. IM
BY Everett A. Gartrell
ATTORNEY United States Patent Office 3,355,335
Patented Nov. 28, 1967

3,355,335
METHOD OF FORMING TUNNELING JUNCTIONS FOR INTERMETALLIC SEMICONDUCTOR DEVICES

James H. Butler, Dudley A. Chance, and Samuel S. Im, Poughkeepsie, N.Y., assignors to International Business Machines Corporation, New York, N.Y., a corporation of New York Filed Oct. 7, 1964, Ser. No. 402,248
17 Claims. (Cl. 148—177)

ABSTRACT OF THE DISCLOSURE

A method of forming a tunneling junction for an intermetallic semiconductor device while simultaneously establishing therefor a current-voltage characteristic having a time-stable valley current comprising heating a degenerative intermetallic semiconductor member of one conductivity type in contact with a significant impurity member of the opposite conductivity determining type in a temperature range sufficient to permit said members to alloy; maintaining said members at said temperature for at least 40 minutes; cooling at a rate of at least 10° C./sec. to ambient temperature to form the tunneling junction. An alternate heating and cooling method is included.

The present invention is directed to methods of forming tunneling junctions for intermetallic semiconductor devices such as tunnel diode devices, and to such devices.

The tunnel diode, like the conventional semiconductor diode, is a two-terminal semiconductor device comprising a semiconductor body or region of one conductivity type separated from another region of the opposite type by a rectification barrier or junction. Unlike the conventional semiconductor diode, the tunnel diode has an abrupt junction with degenerate doping on both sides of that junction, the doping level of a gallium arsenide tunnel diode being of the order of $3\times10^{19}$ to $10\times10^{19}$ impurity atoms per cubic centimeter. This is about four orders of magnitude greater than the doping level found in the usual semiconductor device. As a result, the phenomenon known as quantum mechanical tunneling occurs between the degenerate regions of opposite conductivity type during the operation of the tunnel diode, and the latter exhibits a negative resistance region in its current-voltage characteristic when it is forwardly biased. This phenomenon, together with the tunneling characteristic of the diode, avoids the problem or shortcoming of minority carrier drift time which is present in most semiconductor devices and makes the tunnel diode a fast-operating device which is desirable for many purposes such as high-speed switching and the generation of very high-frequency oscillations.

Intermetallic compounds such as gallium arsenide are capable of withstanding operation at high temperatures and hence are desirable for many tunnel diode device applications. Such materials may be employed as the parent bodies or starting wafers in making tunnel diodes. The starting wafer is very often given a P-type conductivity by heavily doping it with an active impurity material, and this may be accomplished by techniques such as doping with zinc during crystal growth. It should be understood that N-type starting wafers may also be employed in tunnel diodes. At present, the best tunnel diodes are made by the alloy-junction technique for the production of an abrupt junction. When P-type intermetallic semiconductor starting wafers are being utilized, the junction and its associated N-type recrystallized region are usually made degenerative by the application of a donor impurity such as tin, tellurium or sulphur.

Heretofore in the fabrication of tunnel diodes by the alloying technique, a plurality of extremely small members of an impurity material having diameters of about 1 mil were positioned in minute apertures in an insulating film deposited on a semiconductor wafer. The impurity material was then alloyed with the wafer. After alloying to form the tunneling junctions, the wafer was severed into individual diodes.

Prior to the present invention, it was felt that, in the fabrication of a tunneling junction for such an intermetallic semiconductor device, the alloying cycle should be short, requiring fast firing and fast cooling. To that end, heating or firing intervals of about 100 seconds or less at a temperature of about 500° C. followed by rapid cooling such as 50° per second were considered necessary to assure an abrupt tunneling junction in the intermetallic material. Such a procedure was considered necessary to prevent diffusion beyond the junction which would increase its width beyond the tunneling region and thereby impair or destroy its tunneling action.

Applicants have determined that tunnel diode devices fabricated in intermetallic semiconductor material in the manner just mentioned have exhibited intolerable increases in the valley current of their current-voltage characteristic when they are biased for periods of time just beyond the valley. This renders the devices useless for many tunnel diode applications.

It is an object of the present invention, therefore, to provide a new and improved method of forming a tunneling junction for an intermetallic semiconductor device which avoids one or more of the above-mentioned disadvantages and limitations of prior such methods.

It is another object of the invention to provide a new and improved method of forming a tunneling junction for an intermetallic semiconductor device while simultaneously establishing therefor a current-voltage characteristic having a time-stable valley current.

It is a further object of the invention to provide a new and improved method of forming a tunneling junction for a gallium arsenide semiconductor device while simultaneously establishing therefor a current-voltage characteristic having a time-stable valley current.

It is yet another object of the invention to provide a new and improved method of forming a tunneling junction for a gallium arsenide semiconductor device while establishing therefor a current-voltage characteristic which remains stable for over 1000 hours when the device is forwardly biased at about one volt.

It is an additional object of the present invention to provide a new and improved method of simultaneously fabricating an array of quality intermetallic semiconductor devices having tunneling junctions.

It is an additional object of the present invention to provide a new and improved intermetallic semiconductor device having a tunneling junction.

In accordance with a particular form of the invention, the method of forming a tunneling junction for an intermetallic semiconductor device while simultaneously establishing therefor a current-voltage characteristic having a time-stable valley current comprises heating a degenerative intermetallic semiconductor member of one conductivity type in contact with a significant impurity member of the opposite conductivity-determining type in a temperature range sufficient to permit said members to alloy. The method further comprises maintaining the members in the aforesaid range for a prolonged interval, and cooling rapidly to ambient temperature to form the tunneling junction.

The foregoing and other objects, features and advantages of the invention will be apparent from the following more particular description of a preferred embodiment of the invention, as illustrated in the accompanying drawings.

Figure 1:
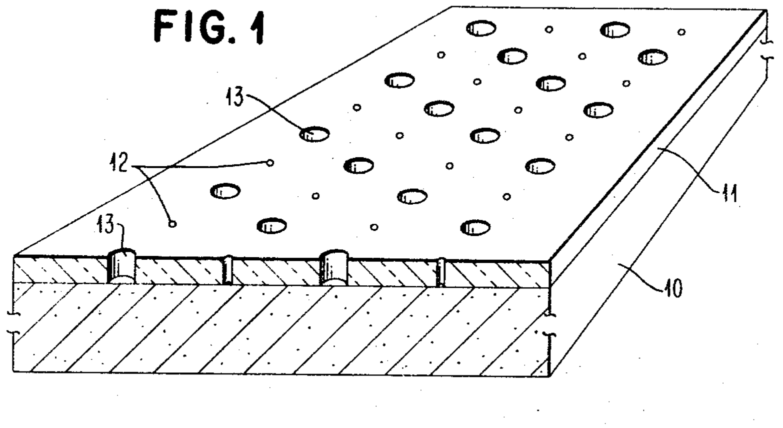
FIG. 1 is a perspective view of a semiconductor starting wafer with a perforated insulating film or coating thereon.

Referring now to FIG. 1 of the drawings, there is represented diagrammatically and to a greatly enlarged scale a semiconductor starting wafer or member 10 of one conductivity type which is useful in the microminiaturized fabrication of an array of intermetallic semiconductor devices having tunneling junctions. To that end, the member 10 may be a suitable intermetallic semiconductor material such as gallium arsenide and may have dimensions of about 0.75 inch x 0.75 inch x 5 mils for the simultaneous fabrication of several hundred tunnel diodes. The semiconductor member is degenerative. The member 10 has adherently attached or bonded to one surface thereof a passivating insulating film 11 having a plurality of apertures 12, 12 and 13, 13 therein which expose selected portions of that surface. The apertures 12, 12 may have a diameter of about 1 mil while that of the apertures 13, 13 is about 5 mils. The apertures are disposed in the alternate relationship represented.

While insulating films of various materials may be employed on the member 10, a very practical film has proved to be one of an oxide of silicon, such as silicon dioxide, or a composite film such as a first film of silicon dioxide having a thin glass sheet or film thereover. Composite films may be applied in the manner disclosed and claimed in the copending application of John A. Perri and Jacob Riseman, Ser. No. 141,669, filed Sept. 25, 1961, and entitled, "Coated Objects and Methods of Providing the Protective Coverings Therefor," and assigned to the same assignee as the present invention. Briefly, this surface coating is accomplished by the thermal decomposition of a siloxane compound in the manner disclosed in Patent 3,089,793 to Eugene L. Jordan and Daniel J. Donahue, granted May 14, 1963, and entitled, "Semiconductor Devices and Methods of Making Them," to form a film which is believed to be predominately silicon dioxide on the surface of the member 10. This film may have a thickness of the order of 4000 angstroms. Thereafter a thin glass film, for example one about 2 microns in thickness, is applied to the silicon dioxide film by centrifuging the assembly in a suspension of finely divided glass particles to form a thin uniform layer of glass particles on the silicon dioxide film, and then chemically bonding the particles to the silicon dioxide film by a heat treatment operation to produce a composite film. For simplicity of representation, such a composite film has been shown in FIG. 1 as the single film 11. The copending application of William A. Pliskin and Ernest E. Conrad, Ser. No. 141,668, filed Sept. 29, 1961, and entitled, "Method of Forming A Glass Film on an Object and the Product Produced Thereby," and assigned to the same assignee as the present invention, discloses and claims the techniques for centrifuging the glass particles and thereafter forming them into a very thin hole-free glass film by heating the glass particles above the softening temperature of the particles.

Apertures 12, 12 and 13, 13 are formed at predetermined locations in the film by conventional photoengraving techniques. In the manner well known in the art, a photoengraving resist (not shown) is placed over the composite film 11 and the resist is then exposed through a master photographic plate having opaque areas corresponding to regions from which the film is to be removed. In the photographic development, the unexposed resist is removed and a corrosive fluid, such as a 20% nitric acid solution, is employed to remove the insulating film from the now exposed regions while the developed resist serves as a mask to prevent chemical etching of the insulating film areas that are to remain on the member 10. After the opening of the holes 12, 12 and 13, 13, the photoengraving resist is removed in a conventional manner.

Figure 2:
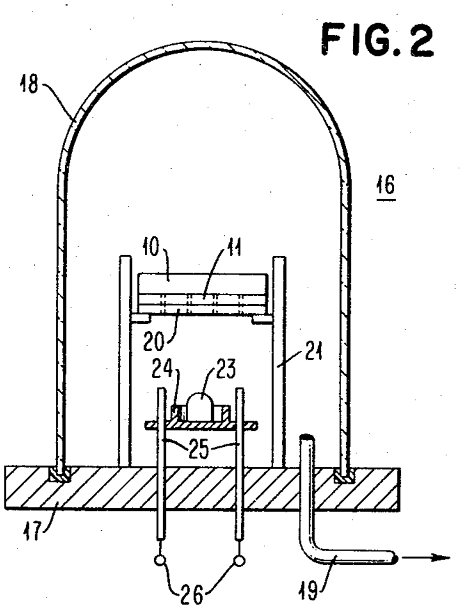
FIG. 2 is a sectional view of an evaporation chamber employed in one of the fabricating steps.

In the next operation there are established on selected portions of the upper surface of the semiconductor member 10 of one conductivity type a plurality of adherent thin metal film members 14, 14 and 15, 15. See FIG. 3. At this time it will be assumed that the semiconductor body is P conductivity gallium arsenide having a significant impurity concentration in the range of $3\times10^{19}$ to $10\times10^{19}$ atoms per cubic centimeter, $3\times10^{19}$ to $5\times10^{19}$ being a more usual range. Very satisfactory tunnel diode devices have been fabricated by the techniques of the present invention using gallium arsenide members 10 having a zinc impurity concentration of about $4\times10^{19}$ atoms per cubic centimeter. The film members 14, 14 and 15, 15 are preferably deposited by a vaporizing operation on the portions of the surface of the member 10 which are exposed by the apertures 12, 12 and 13, 13 in the insulating film 11. This may be accomplished in a known manner in a conventional vaporizer 16 such as the one represented diagrammatically in FIG. 2. The vaporizer includes a base 17 and a cover 18 that may be sealed thereto during the evacuation of air from its chamber through a tube 19. The unit of FIG. 1 rests in an inverted position on an apertured mask 20 of a metal such as molybdenum which in turn rests on a suitable support 21. The apertures in the mask conform in size and in position with those in the film 11, and are in registration therewith. Metal 23 to be vaporized on the surface of the member 10 exposed by the apertures 12, 12 and 13, 13 in the film is heated in a filament cup 24 which is connected to a source of electrical energy through a pair of supporting leads 25, 25 and terminals 26, 26. When the semiconductor member 10 is made of gallium arsenide, a suitable material for the film members 14, 14 and 15, 15 is silver or gold.

Figure 3:
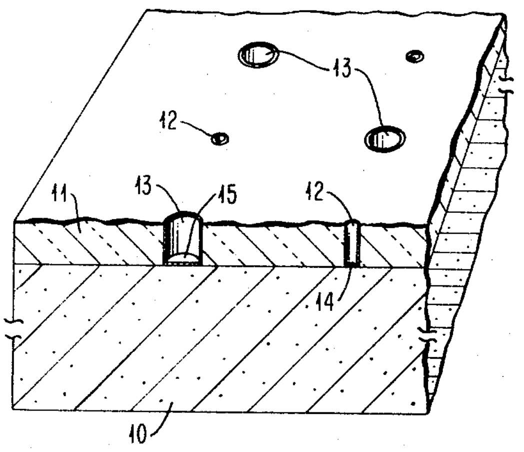
FIG. 3 is a greatly enlarged perspective view of a portion of the starting wafer after its removal from the chamber of FIG. 2.

Next, the unit of FIG. 3 is preferably, although not necessarily, momentarily immersed in a conventional solder flux bath. Thereafter it is preferably, though not necessarily, heated gradually to about 200° C. on a heater such as a hot plate. Then the hot unit is introduced into a bath 27 (see FIG. 4) of a molten material which has a temperature less than the melting point of the member 10 and comprises (a) a conductivity-directing impurity of a type opposite to that of the member and has an affinity for the metal of the members 14, 14 and 15, 15 and (b) a quantity or piece 28 of the above-mentioned metal such as silver which substantially saturates the bath, whereby particles of the molten material of the bath adhere to the members 14, 14 and 15, 15. When the semiconductor member 10 is P-type gallium arsenide, the molten bath comprises the N-type impurity tin, selenium, tellurium or sulphur with indium or gold as the carrier metal. The bath may include about 1% by weight of the doping impurity and the balance the carrier metal and is held in the range of about 225–280° C. Good results have also been obtained with baths containing 5% tin by weight and the balance gold. The bath may also be of pure tin. Baths containing 0–70% gold and the balance tin may be used; the higher the gold content of the bath, the higher the temperature thereof. When the unit is removed from the molten bath, which hereinafter will be referred to as the solder bath, droplets 29, 29 and 30, 30 (see FIG. 5) of solder rest in the apertures 12, 12 and 13, 13 and cling tenaciously to the thin film members 14, 14 and 15, 15. Surface tension forces cause the molten solder to ball up above the upper surface of the thin film 17 and, upon solidification after removal of the unit from the bath, to appear as protruding droplets.

Figure 4:
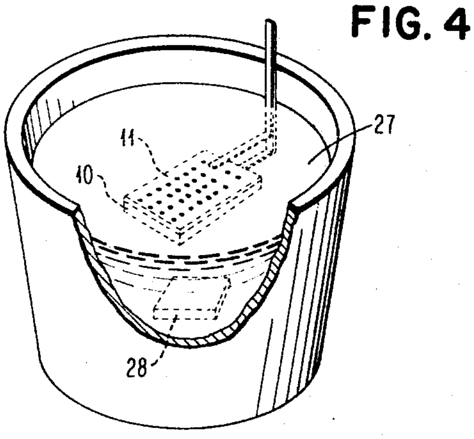
FIG. 4 is a perspective view employed in explaining a dipping operation which is practiced.

At this time, it is desirable to consider further the metals employed as the film members 14, 14 and 15, 15 and the metals in the molten bath 27. The metal for use as the film members should be one which has a affinity for the metals in the molten bath 27 so as to promote the lodging and adherence of droplets of the bath material in apertures 12, 12 and 13, 13 in the insulating film 11. Also, in an alloying operation to be described subsequently, the metal of the film should have a sufficiently high solubility in droplets of the solder bath that it will dissolve completely in and alloy with those droplets. Silver, for example, is an excellent metal having such characteristics. In FIG. 4, the piece of silver 28 is employed in the molten bath 27 to insure that the latter is supersaturated with silver in order that the bath material will not, during the described dipping operation, dissolve the silver constituting the film members 14, 14 and 15, 15.

Figure 6:
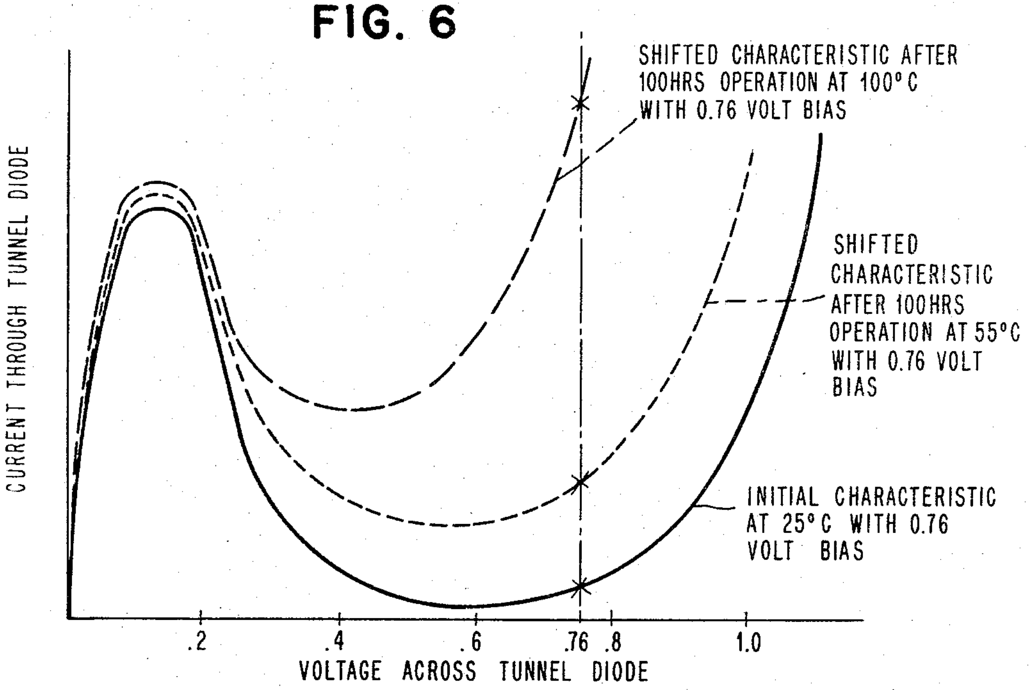
FIG. 6 is a family of charcteristic curves of a tunnel diode.

In accordance with the present invention, the method of forming a tunneling junction for an intermetallic semiconductor device is effective simultaneously to establish therefor a current-voltage characteristic having a time-stable valley current. An understanding of what is meant by a current-voltage characteristic having a time-stable valley current will be facilitated by referring to FIG. 6 of the drawings. Solid-line Curve A represents the typical N-shaped characteristic of a tunnel diode device at room temperature of about 25° C. when it is first placed in operation. When the device is in circuit, it is customary to bias it forwardly at a point beyond the lowest point of the valley, such as at the point *p*. Such a bias may be, for example, in the range of 0.76 to 1 volt. Unfortunately, when an intermetallic tunnel diode device, which is not constructed in accordance with the method of the present invention, is continued in operation for periods of time such as several to 100 hours, a permanent shift in its characteristic occurs, as represented by the brokenline Curves B and C for operating temperatures such as 55° C. and 100° C., respectively. This shift also occurs, but at a slower rate, when the device is operated at a lower temperature such as near room temperature. Curve C is a characteristic which prevails when a typical such device is operated at a bias of 0.76 volt at 100° C. for 100 hours. Manifestly, the operation of a tunnel diode device when its characteristic corresponds to Curves C or B is distinctly different from what prevails when it was first placed in operation when its characteristic was that of Curve A. For many applications, reliable performance in accordance with the characteristic of Curve A is required during the entire period of operation of the device. The method of forming the tunneling junction of the present invention is effective to produce a device providing such performance. Continuous operation in accordance with Curve A may be said to be pursuant to a current-voltage characteristic having a time-stable valley current.

Figures 5, 8, 9:
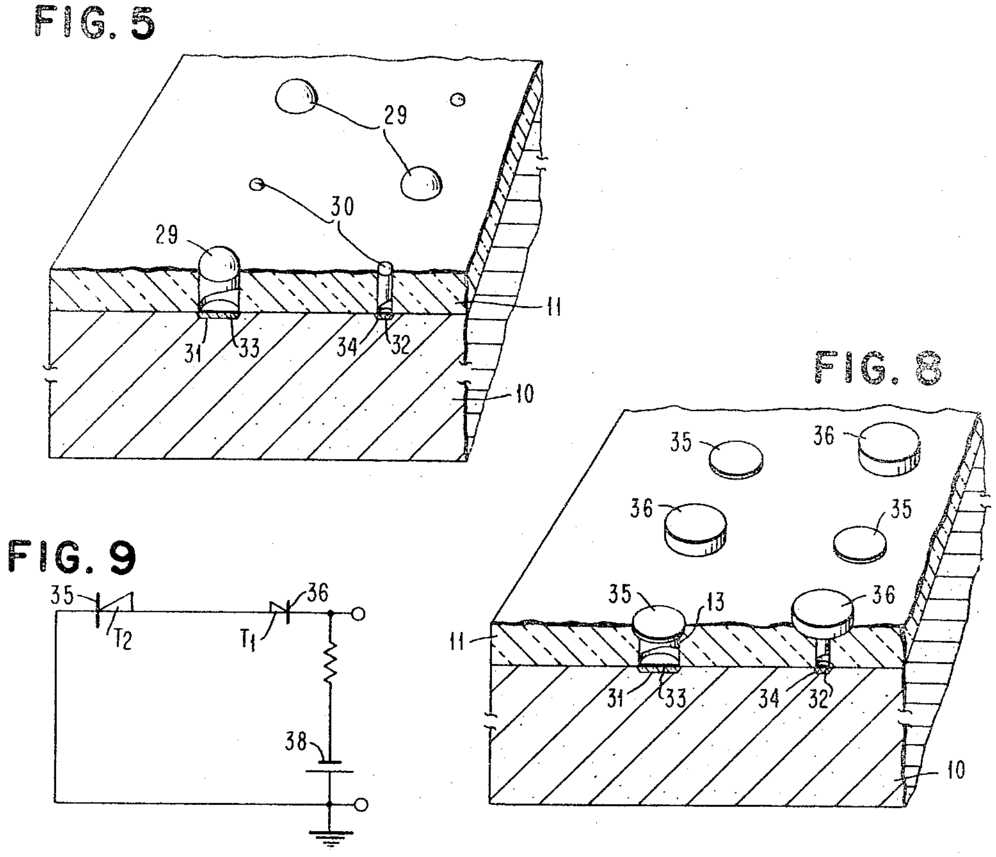
FIG. 5 is a perspective view of a portion of the device after the FIG. 4 operation.
FIG. 8 is another perspective view of that portion of the device of FIG. 5 after a subsequent operation.
FIG. 9 is a circuit diagram showing the manner in which a tunnel diode device constructed in accordance with the invention may be connected in an electrical circuit.

In accordance with the invention, the method of forming a tunneling junction for an intermetallic semiconductor device while simultaneously establishing therefor a current-voltage characteristic having a time-stable valley current comprises heating the degenerate intermetallic or gallium arsenide semi-conductor member 10 of the one or P-conductivity type in contact with a significant impurity member, such as the tin in the droplets 29, 29 and 30, 30 of FIG. 5, in a temperature range sufficient to permit those members to alloy. To that end, the assembly of FIG. 5 is placed in a nonoxidizing atmosphere such as nitrogen gas on a hot plate or in a conventional alloying furnace where it is maintained at a temperature in the range of 450–630° C. for a prolonged interval such as at least 40 minutes. A substantially constant temperature of about 480°, as represented by the solid-line Curve M of FIG. 7 and maintained for about 60 minutes, has proved to be particularly attractive for a gallium arsenide device employing a P-type member 10.

Figure 7:
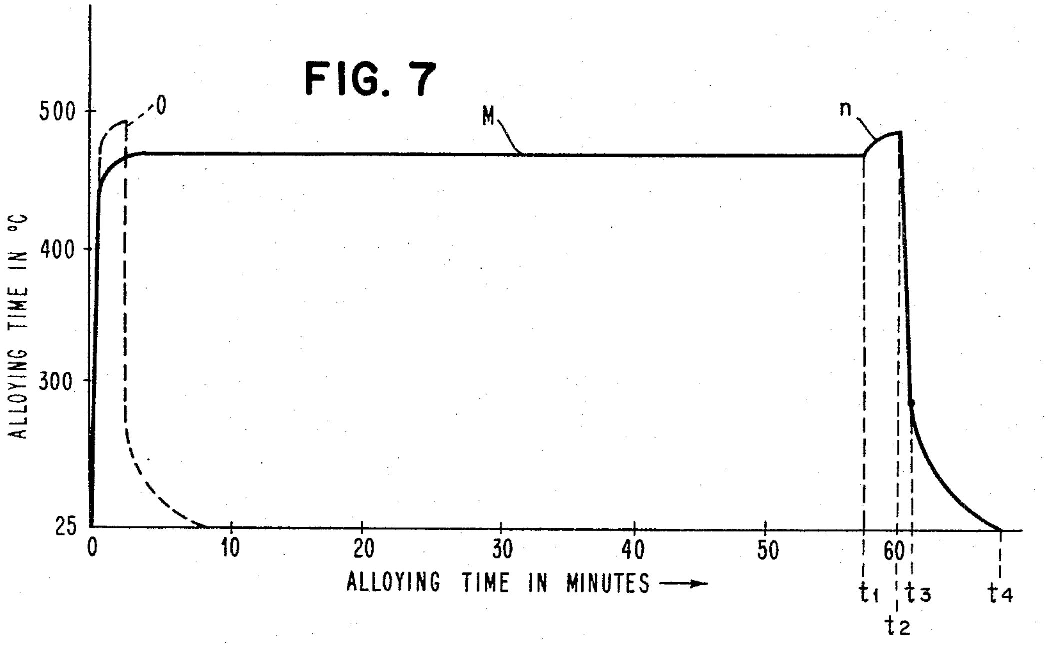
FIG. 7 is a graph employed in explaining the method of the invention.

For some applications, such as in the fabrication of very high speed tunnel diodes, it may be desirable to increase the temperature of the members 10, 29, 29 and 30, 30 a maximum 20° in 3–5 minutes at the end of the heating interval as represented by the protuberance *n* in Curve M during the interval $t_1$–$t_2$ in this FIG. 7. This supplementary heating procedure is effective to increase the speed of the resultant diode devices by creating much more abrupt junctions. Experience has indicated that this heating procedure is effective to increase the speed of the devices receiving that treatment as much as four times that of devices not given that additional heat treatment. Thereafter the assembly is removed from the hot plate or the alloying furnace.

In the next step, the assembly of FIG. 5, which includes the members 10, 29, 29 and 30, 30, are cooled rapidly to ambient temperature to form a plurality of abrupt tunneling junctions 31, 31 and 32, 32, such as the two represented, together with recrystallized semiconductor regions 33, 33 and 34, 34 of the opposite or N-conductivity type. The cooling may be accomplished by subjecting the assembly to a stream of an inert gas such as nitrogen to reduce the assembly temperature at the rate of at least 10° C. per second. This cooling rate may be in the range of 10–60° C. per second. Preferably the rapid cooling is accomplished by dropping the temperature to about 300° C., such as that represented during the interval $t_2$–$t_3$ of FIG. 7, and this is followed by slow cooling for several minutes, such as 5 minutes, to ambient temperature as during the interval $t_3$–$t_4$. When the semiconductor body 10 is P-type gallium arsenide, the silver film members alloy with the molten droplets, the carrier metal gold or silver as the case may be, dissolves the semiconductor material thereunder and the dopant imparts an N-type conductivity of the molten semiconductor material which thereafter solidifies. When the bath contains substantially pure tin, the tin serves as the semiconductor solvent and doping material. The junctions 31 and 32 formed between the degenerative N- and P-type regions are very abrupt and are capable of exhibiting quantum mechanical tunneling. The composite insulating film 11 is one which is capable of withstanding the alloying temperatures mentioned above.

The heat treatment cycle described above may be compared with a conventional heat treatment cycle represented by the broken-line Curve O which involves rapid heating to about 500° C. in about 100 seconds or less followed by rapid quenching such as 50° C. per second.

In the next operation the droplets 29, 29 and 30, 30 of solder in the apertures 12, 12 and 13, 13 are removed with an etching solution that dissolves the solder but does not attack the recrystallized regions 33, 33 and 34, 34. A 20% solution of either nitric acid or hydrochloric acid is useful for that purpose. In a subsequent vaporizing operation, a metal having a higher melting point than the solder droplets is evaporated in a conventional manner so as to make ohmic contacts with the recrystallized regions 32, 32 and 33, 33 and to form on the surface of the insulating film 11 terminals 35, 35 and 36, 36 as represented in FIG. 8. When the member 10 is made of gallium arsenide, gold is a suitable high temperature material for forming the ohmic contacts and terminals.

The tunneling junctions 34, 34 are those which are to be employed because of the negative resistance characteristics of the diodes asosciated therewith. As thus far described, their peak-current carrying capacities are purposely greater than the final value thereof. The assembly or unit of FIG. 8 is then heated for a predetermined time and at a predetermined temperature to cause a diffusion of the impurities across the abrupt junctions 31, 31 and 32, 32 and a consequent widening thereof. This in turn decreases the peak-current carrying capacities of the tunnel diode devices associated with the junctions 32, 32 to substantially a predetermined value. The necessary thermal cycle for this diffusion operation can be determined empirically by measuring the rate of decrease of the peak current associated with the junctions 32, 32 for various temperatures. For example, it has been found that for certain gallium arsenide tunnel diodes that the change in peak current with temperature at 400° C. is equal to a decrease of 1 milliampere per minute. Once the rate of change has been determined empirically for a sample tunnel diode corresponding to the ones being fabricated, the peak current of an array of such tunnel diodes may be tailored to a desired value by a heat treating operation in the vicinity of about 400° C.

For some applications it may be desirable to heat treat the array of junctions 32, 32 en mass, as explained above, to achieve an approximate peak current carrying capacity for the diodes, and thereafter to heat treat the diodes individually to realize the desired rated peak currents. In the latter instance, the array would be severed in a conventional manner as by ultrasonic cutting into a plurality of tunnel diodes, each comprising a structure which includes the terminals 35 and 36 and the junction regions associated therewith. Thereafter the heat treatment or junction thermal tailoring operations could be carried out in the manner explained above to secure the precise peak current values which were desired.

Figure 10:
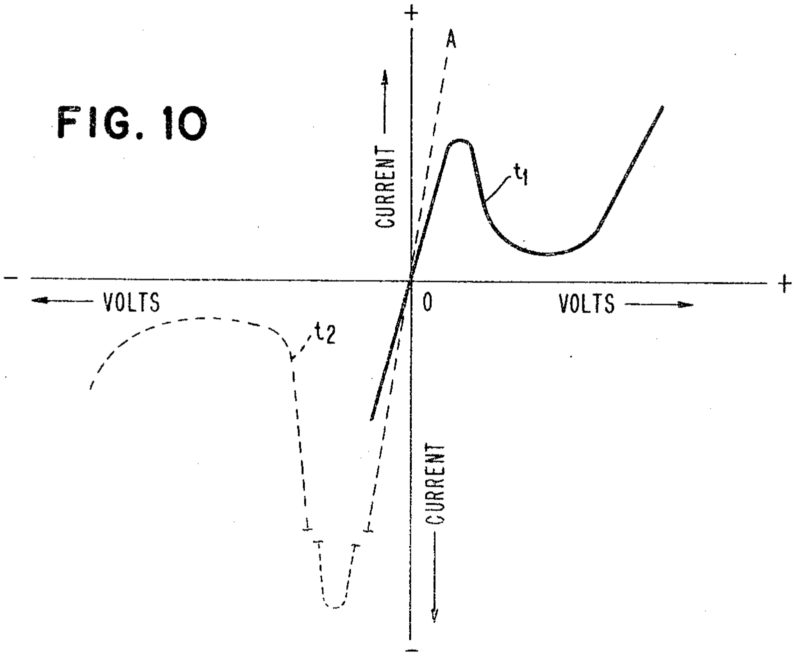
FIG. 10 includes characteristic curves used in explaining the various connections of the tunnel diode devices represented in FIG. 9.

Assuming now that we are dealing with a tunnel diode which has been fabricated in the manner explained above and includes a pair of terminals 35 and 36, if the device is connected in a simplified circuit such as that represented in FIG. 9, it will exhibit the characteristics represented in FIG. 10. The tunnel diode device actually includes two tunnel diodes, designated $T_1$ and $T_2$ in FIG. 9, which correspond to the diodes associated with the junctions 32 and 31, respectively, shown in FIG. 8. The smaller diode $T_1$ is biased in the forward direction by a battery 38 while the larger diode $T_2$ is biased in the opposite sense. The characteristic of the diode $T_1$ is represented in FIG. 10 by the full-line curve $t_1$ while that of the diode $T_2$ is shown by the brokenline curve $t_2$. Diode $T_1$ is employed so that it operates in its forwardly biased region of its characteristic. Diode $T_2$ is employed so that it does not operate in its negative resistance region but rather operates in the region O-A where it presents a very low resistance and hence serves as an ohmic contact. Thus the diode $T_2$ and its tunneling junction are employed so that the diode serves as an excellent current conductor in a circuit which includes the tunnel diode $T_1$. It will be seen, therefore, that the procedure simultaneously forms two groups of tunneling junctions, the negative resistance characteristic of one group of which may be conveniently employed while the low ohmic characteristic of the other group may be utilized.

From the foregoing description and explanation, it will be seen that the method of the present invention for forming tunneling junctions for intermetallic semiconductor devices is effective to establish for those devices a current-voltage characteristic which is time stable.

While the invention has been shown and described with reference to a preferred embodiment thereof, it will be understood by those skilled in the art that various changes in form and details may be made therein without departing from the spirit and scope of the invention.

What is claimed is:

1. The method of forming a tunneling junction for an intermetallic semiconductor device while simultaneously establishing therefor a current-voltage characteristic having a time-stable valley current comprising:
heating a degenerative P-type gallium arsenide semiconductor member in contact with an N-type significant impurity member in a temperature range of 450–630° C. to permit said members to alloy;
maintaining said members in said range for an interval of at least 40 minutes; and
cooling said members rapidly at a rate of at least 10° C./second to approximately 300° C. and thereafter cooling slowly for several minutes to ambient temperature to form said tunneling junction.

2. The method of forming a tunneling junction for a high-speed intermetallic semiconductor device while simultaneously establishing therefor a current-voltage characteristic having a time-stable valley current comprising:
heating a degenerative P-type gallium arsenide semiconductor member in contact with an N-type significant impurity member at a substantially constant temperature in a temperature range of 450–630° C. to permit said members to alloy;
maintaining said members at said temperature for an interval of at least 40 minutes;
increasing the temperature of said members a maximum of 20° C. in 3–5 minutes; and
cooling said members rapidly at a rate of at least 10° c./second to approximately 300° C. and thereafter cooling slowly for several minutes to ambient temperature to form said tunneling junction.

3. The method of forming a tunneling junction for an intermetallic semiconductor device while simultaneously establishing therefor a current-voltage charactertistic having a time-stable valley current comprising:
heating a degenerative P-type gallium arsenide semiconductor member in contact with an N-type significant impurity member at a substantially constant temperature of about 480° C. to permit said members to alloy;
maintaining said members at said temperature for an interval of about 60 minutes; and
cooling said members rapidly with a stream of nitrogen gas at a rate in the range of 10–60° C./second to approximately 300° C. and thereafter cooling slowly for several minutes to ambient temperature to form said tunneling junction.

4. The method of forming a tunneling junction for a high-speed intermetallic semiconductor device while simultaneously establishing therefor a current-voltage characteristic having a time-stable valley current comprising:
heating a degenerative P-type gallium arsenide semiconductor member in contact with a tin impurity member at a substantially constant temperature of about 480° C. sufficient to permit said members to alloy;
maintaining said members at said temperature for an interval of about 70 minutes;
increasing the temperature of said members about 20° C. in 3–5 minutes; and
cooling said members to 200° C. in about 1 minute with a stream of nitrogen gas to approximately 300° C. and thereafter cooling slowly for several minutes to ambient temperature to form said tunneling junction.

5. The method of forming a tunneling junction for an intermetallic semiconductor device while simultaneously establishing therefor a current-voltage characteristic having a time-stable valley current comprising:
heating a degenerative intermetallic semiconductor member of one conductivity type in contact with a significant impurity member of the opposite conductivity-determining type in a temperature range sufficient to permit said members to alloy;
maintaining said members in said range for an interval of at least 40 minutes; and
cooling said members rapidly at a rate of at least 10°

C./second to ambient temperature to form said tunneling junction.

6. The method of forming a tunneling junction for an intermetallic semiconductor device while simultaneously establishing therefor a current-voltage characteristic having a time-stable valley current comprising:
heating a degenerative intermetallic semiconductor member of one conductivity type in contact with a significant impurity member of the opposite conductivity-determining type in a temperature range sufficient to permit said members to alloy;
maintaining said members in said range for an interval of 40–60 minutes; and
cooling said members rapidly at a rate of at least 10° C./second to ambient temperature to form said tunneling junction.

7. The method of forming a tunneling junction for an intermetallic semiconductor device while simultaneously establishing therefor a current-voltage characteristic having a time-stable valley current comprising:
heating a degenerative intermetallic semiconductor member of one conductivity type in contact with a significant impurity member of the opposite conductivity-determining type in a temperature range sufficient to permit said members to alloy;
maintaining said members in said range for an interval of at least 40 minutes;
cooling said members at a rate in the range of 10–60° C./second to ambient temperature to form said tunneling junction.

8. The method of forming a tunneling junction for an intermetallic semiconductor device while simultaneously establishing therefor a current-voltage characteristic having a time-stable valley current comprising:
heating a degenerative intermetallic semiconductor member of one conductivity type in contact with a significant impurity members of the opposite conductivity-determining type in a temperature range of 450–630° C. to permit said members to alloy;
maintaining said members in said range for an interval of at least 40 minutes;
cooling said members rapidly at a rate of at least 10° C./second to ambient temperature to form said tunneling junction.

9. The method of forming a tunneling junction for a high-speed intermetallic semiconductor device while simultaneously establishing therefor a current-voltage characteristic having a time-stable valley current comprising:
heating a degenerative intermetallic semiconductor member of a first conductivity type in contact with a significant impurity member of the opposite conductivity-determining type at a substantially constant temperature in a temperature range sufficient to permit said members to alloy;
maintaining said members at said temperature for an interval of at least 40 minutes;
increasing the temperature of said members a maximum of 20° C. in 3–5 minutes; and
cooling said members rapidly at a rate of at least 10° C./second to approximately 300° C. and thereafter cooling slowly for several minutes to ambient temperature to form said tunneling junction.

10. The method of forming a tunneling junction for an intermetallic semiconductor device while simultaneously establishing therefor a current-voltage characteristic having a time-stable valley current comprising:
heating a degenerative intermetallic semiconductor member of a first conductivity type in contact with a significant impurity member of the opposite conductivity-determining type in a temperature range sufficient to permit said members to alloy;
maintaining said members in said range for an interval of 40–60 minutes; and
cooling said members at a rate of at least 10° C./second to approximately 300° C. and thereafter cooling slowly for several minutes to ambient temperature to form said tunneling junction.

11. The method of forming a tunneling junction for an intermetallic semiconductor device while simultaneously establishing therefor a current-voltage characteristic having a time-stable valley current comprising:
heating a degenerative intermetallic semiconductor member of one conductivity type in contact with a significant impurity member of the opposite conductivity-determining type in a temperature range sufficient to permit said members to alloy;
maintaining said members in said range for an interval of at least 40 minutes;
cooling said members rapidly at a rate of at least 10° C./second to approximately 300° C. and thereafter cooling slowly for several minutes to ambient temperature to form said tunneling junction.

12. The method of forming a tunneling junction for an intermetallic semiconductor device while simultaneously establishing therefor a current-voltage characteristic having a time-stable valley current comprising:
heating a degenerative intermetallic semiconductor member of one conductivity type in contact with a significant impurity member of the opposite conductivity-determining type in a temperature range of 450° to 630° to permit said members to alloy;
maintaining said members in said range for an interval of at least 40 minutes;
cooling said members rapidly at a rate of at least 10° C./second to approximately 300° C. and thereafter cooling slowly for several minutes to ambient temperature to form said tunneling junction.

13. The method of forming a tunneling junction for a high-speed intermetallic semiconductor device while simultaneously establishing therefor a current-voltage characteristic having a time-stable valley current comprising:
heating a degenerative intermetallic semiconductor member of a first conductivity type in contact with a significant impurity member of the opposite conductivity-determining type at a substantially constant temperature in a temperature range of 450°–630° C. to permit said members to alloy;
maintaining said members at said temperature for an interval of at least 40 minutes;
increasing the temperature of said members a maximum of 20° C. in 3–5 minutes; and
cooling said members rapidly at a rate of at least 10° C./second to approximately 300° C. and thereafter cooling slowly for several minutes to ambient temperature to form said tunneling junction.

14. The method of forming a tunneling junction for an intermetallic semiconductor device while simultaneously establishing therefor a current-voltage characteristic having a time-stable valley current comprising:
heating a degenerative P-type intermetallic semiconductor member in contact with an N-type significant impurity member in a temperature range sufficient to permit said members to alloy;
maintaining said members in said range for an interval of at least 40 minutes;
cooling said members rapidly at a rate of at least 10° C./second in a stream of an inert gas to ambient temperature to form said tunneling junction.

15. The method of forming a tunneling junction for an intermetallic semiconductor device while simultaneously establishing therefor a current-voltage characteristic having a time-stable valley current comprising:
heating a degenerative P-type intermetallic semiconductor member in contact with an N-type significant impurity member in a temperature range of 450–630° C. to permit said members to alloy;
maintaining said members in said range for an interval of at least 40 minutes;
cooling said members rapidly at a rate of at least 10°

C./second to ambient temperature to form said tunneling junction.

16. The method of forming a tunneling junction for an intermetallic semiconductor device while simultaneously establishing therefor a current-voltage characteristic having a time-stable valley current comprising:

heating a degenerative P-type gallium arenside semiconductor member having a zinc impurity concentration in the range of $3\times10^{19}$—$5\times10^{19}$ atoms/cu. cm. in contact with an N-type significant impurity member at a temperature of about 480° C. to permit said members to alloy;

maintaining said members in said range for an interval of at least 40 minutes;

cooling said members rapidly at a rate of at least 10° C./second to ambient temperature to form said tunneling junction.

17. The method of forming a tunneling junction for an intermetallic semiconductor device while simultaneously establishing therefor a current-voltage characteristic having a time-stable valley current comprising:

heating a degenerative P-type gallium arsenide semiconductor member in contact with a tin impurity member in a temperature range of 450–630° C. to permit said members to alloy;

maintaining said members in said range for an interval of at least 40 minutes;

cooling said members rapidly at a rate of at least 10° C./second to approximately 300° C. and thereafter cooling slowly for several minutes to ambient temperature to form said tunneling junction.

References Cited

UNITED STATES PATENTS

| | | | |
|---|---|---|---|
| 2,932,594 | 4/1960 | Mueller ---------- | 148—181 X |
| 3,054,701 | 9/1962 | John ------------ | 148—181 X |
| 3,131,096 | 4/1964 | Sommers. | |
| 3,175,934 | 3/1965 | Tomono ----------- | 148—177 |
| 3,245,847 | 9/1966 | Pizzarello ---------- | 148—177 |
| 3,272,669 | 9/1966 | Im ---------------- | 148—179 |

HYLAND BIZOT, *Primary Examiner.*